United States Patent [19]

Amador et al.

[11] Patent Number: 5,114,066
[45] Date of Patent: May 19, 1992

[54] VOICE COIL PROGRAMMABLE WIRE TENSIONER

[75] Inventors: Gonzalo Amador, Dallas; Randy O. Burrows, Lubbock; George C. Epp, Van Alstyne, all of Tex.

[73] Assignee: Texas Instruments Incorporated, Dallas, Tex.

[21] Appl. No.: 616,035

[22] Filed: Nov. 20, 1990

[51] Int. Cl.⁵ .............................. B23K 37/00
[52] U.S. Cl. .......................... 228/4.5; 228/8
[58] Field of Search ............. 228/4.5, 8, 9, 41, 102, 228/104, 179, 244, 904

[56] References Cited

U.S. PATENT DOCUMENTS

| | | | |
|---|---|---|---|
| 3,672,556 | 6/1972 | Diepeveen | 228/4.5 |
| 4,202,482 | 5/1980 | Sade et al. | 228/4.5 |
| 4,600,138 | 7/1986 | Hill | 228/179 |
| 4,653,681 | 3/1987 | Dreibelbis et al. | 228/8 |

*Primary Examiner*—Samuel M. Heinrich
*Attorney, Agent, or Firm*—B. Peter Barndt; Richard Donaldson; William E. Hiller

[57] ABSTRACT

A voice coil actuated wire tensioner is used on a wire bonder in conjunction with a primary wire clamp to provide accurate control of the bond wire and looping of the bond wire between ball bonding of one end of a bond wire and stitch bonding of the other end of the bond wire.

17 Claims, 7 Drawing Sheets

VOICE COIL PROGRAMMABLE WIRE TENSIONER

FIELD OF THE INVENTION

This invention relates to wire bonding machines, and more particularly to a programmable wire tensioner utilizing a voice coil actuated tensioning mechanism.

BACKGROUND OF THE INVENTION

To achieve the best wire dress and ball centering in wire bonding, the tension on the wire must be changed at different phases of the bond cycle. This is especially true as the pin count of the bonded device increases, the pitch between bonded wires decreases, and/or the length of the bonded wire increases. In each of these cases, the need to control the length and shape of the bonded wire is paramount.

Prior art wire tensioners provided a static drag force to the bond wire. This is accomplished, for example, by sandwiching the wire between a felt pad and a metal pad. The felt pad is compressed against the metal pad by an extension spring. Tension on the wire is varied by adjusting a set screw to increase or decrease the compression of the felt pad.

During gold wire bonding a small amount of drag force is required to pull the gold ball on the end of the wire into the capillary before the ball bond is performed. A large force is needed to pull wire through the capillary during the move from ball bond to stitch bond to form an acceptable wire loop. A compromise between the small force needed for ball centering and the large force needed for wire looping is necessary when using a fixed force wire tensioner. Therefore, the force is not optimized for either operation.

BRIEF SUMMARY OF THE INVENTION

The present invention is a programmable wire tensioner which allows the amount of force applied to the wire during the bond cycle of a wire bonder to be varied dynamically. It does so using voice coil technology. The movable jaw of the tensioner consists of a plastic or non-magnetic sleeve, for example Delrin, with a coil wound on it and a hard polished non-magnetic clamping surface, fro example stainless steel, attached to it. It rides on a stationary rare earth permanent magnet. The magnetic circuit is completed by a mild steel cup. The coil of the movable jaw resides in a constant magnetic field. The bonding wire is sandwiched between the movable jaw clamping surface and stationary jaw surface. The force the movable jaw exerts on the bonding wire is a function of the magnetic field and the current in the coil.

Since the magnetic field is constant, the force is directly proportional to the current in the coil. Therefore a desired force can be applied to the bonding wire by controlling the current to the coil. The current is controlled by using a current driver circuit. This circuit has a software generated word as the input to its digital to analog converter. This gives the software real time control of the current to the tensioner, providing real time control of the force delivered by the tensioner. The voice coil tensioner is used in conjunction with a primary clamp device on the bond head of the wire bonder.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
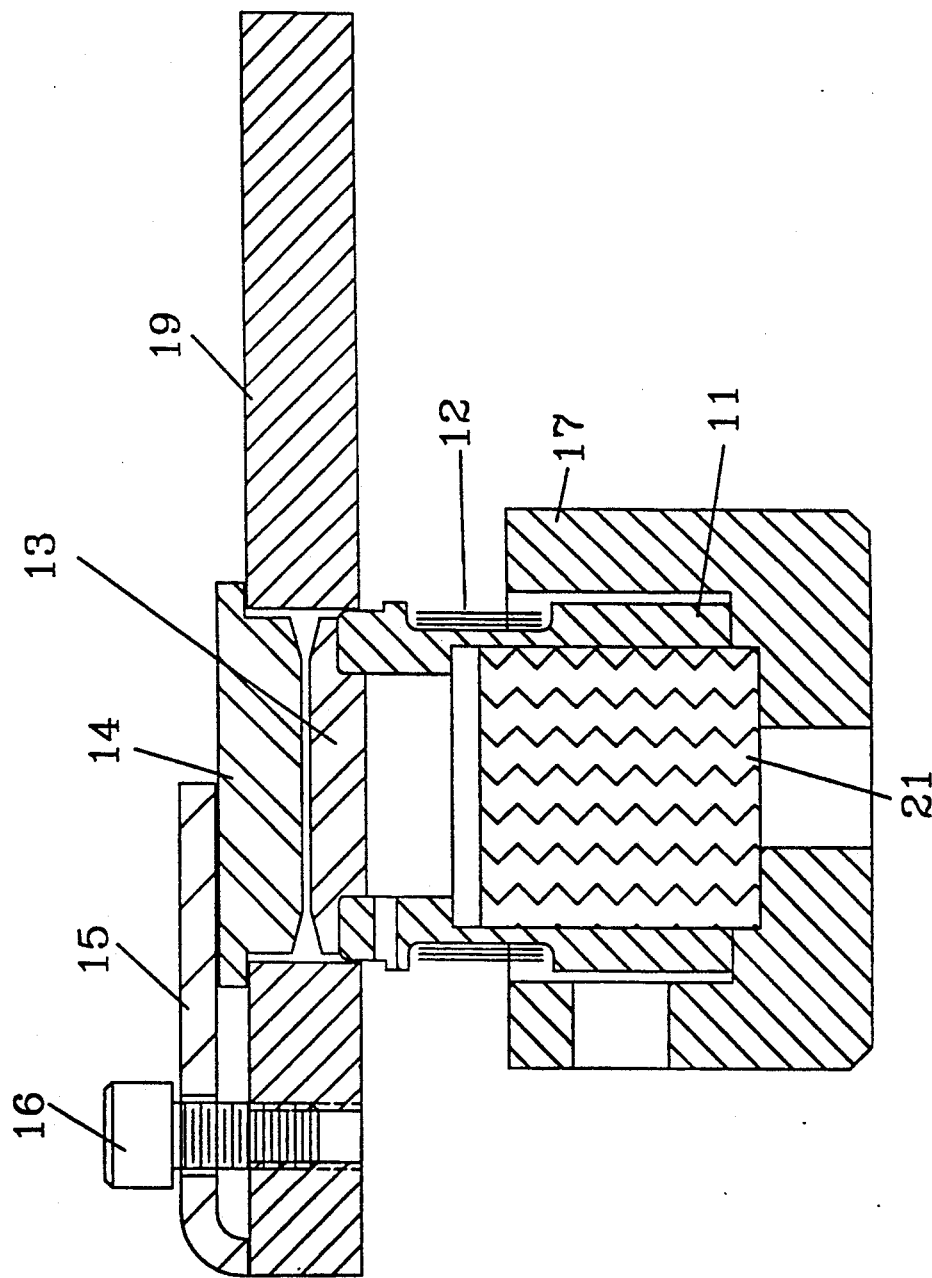
FIG. 1 is a cross-sectional view of the tensioning mechanism of the voice coil tensioner.

FIG. 1 is a cross-sectional view of the active elements of the voice coil tensioner. The movable jaw assembly includes a coil form 11 having wire coils 12 wound around coil form 11. Clamp face 13 is attached to the coil form. Coil form 11 is hollow and has opening 11a which provides a bushing surface to ride on the permanent magnet 21. Permanent magnet 21 resides in steel cup 17. The second clamp face is held in face plate 19 by retainer strap 15 and screw 16.

Figure 2:
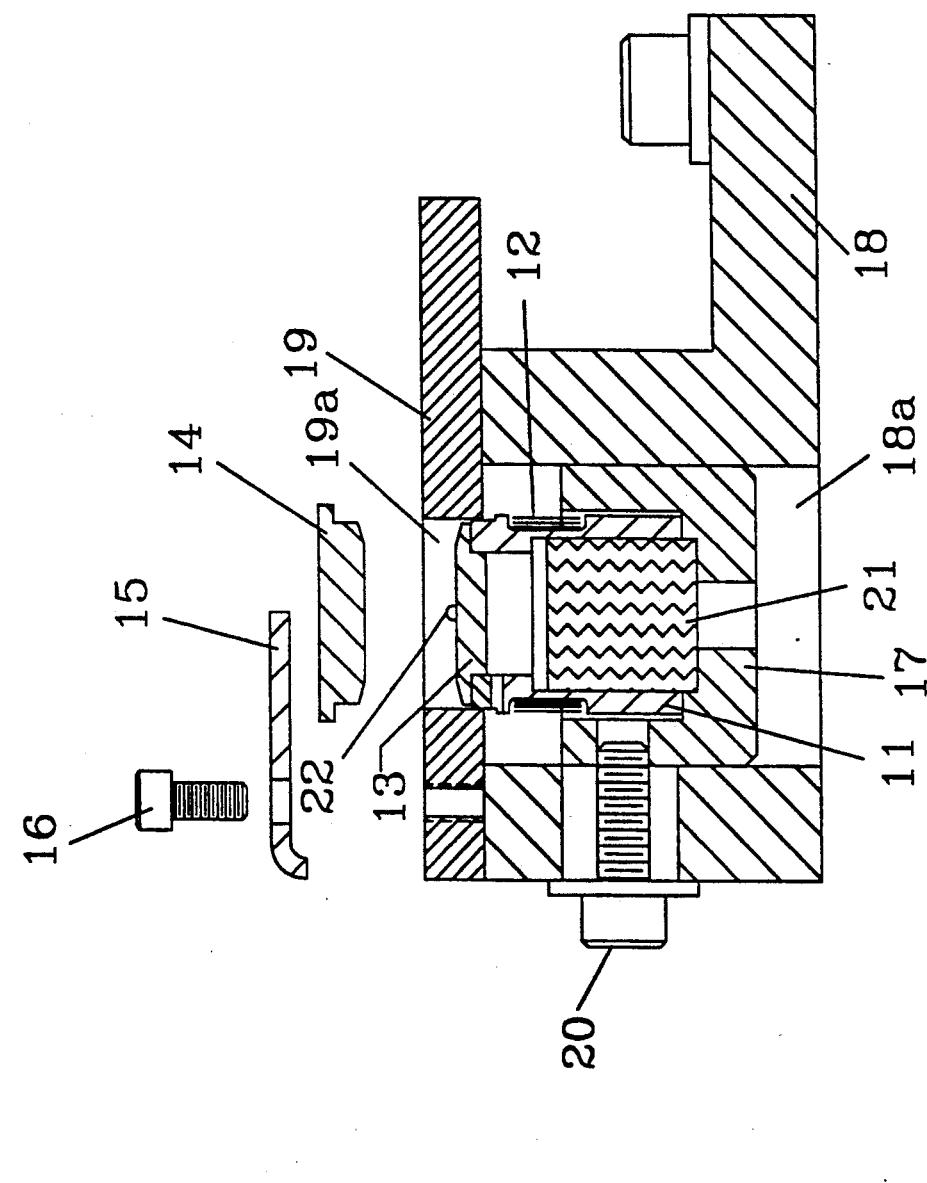
FIG. 2 illustrates the voice coil tensioner assembly.

FIG. 2 illustrates the voice coil tensioner clamp assembly 10. Illustrated is mount 18 with steel cup 17 positioned within the opening. Steel cup 17 is held in place by retainer screw 20. Face plate 19 is mounted on mount 18 and has an opening 19a into which clamp face 13 moves when the tensioner is activated.

Second clamp face 14 is secured to face plate 19 by retainer strap 15 and screw 16.

In FIG. 2, the second clamp face 14, retainer strap 15 and screw 16 are shown exploded away from the assembly for clarity of illustration. Hole 22, in the top of opening 19a, is the opening through which the bond wire is fed between clamp faces 13 and 14.

Figure 3:
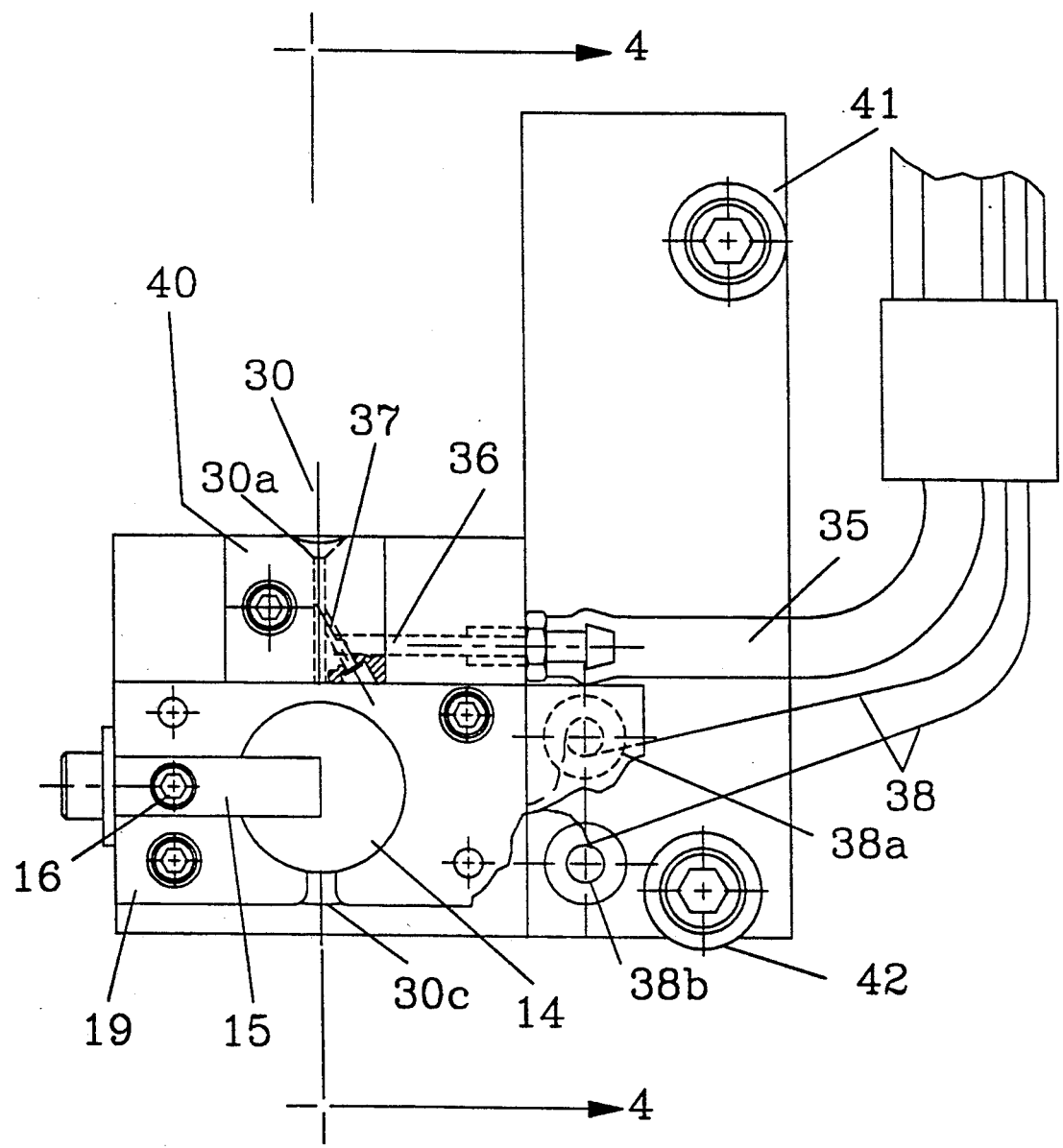
FIG. 3 illustrates a front view of the voice coil tensioner assembly including an interface cable, air hose and wire pull back.
Figure 4:
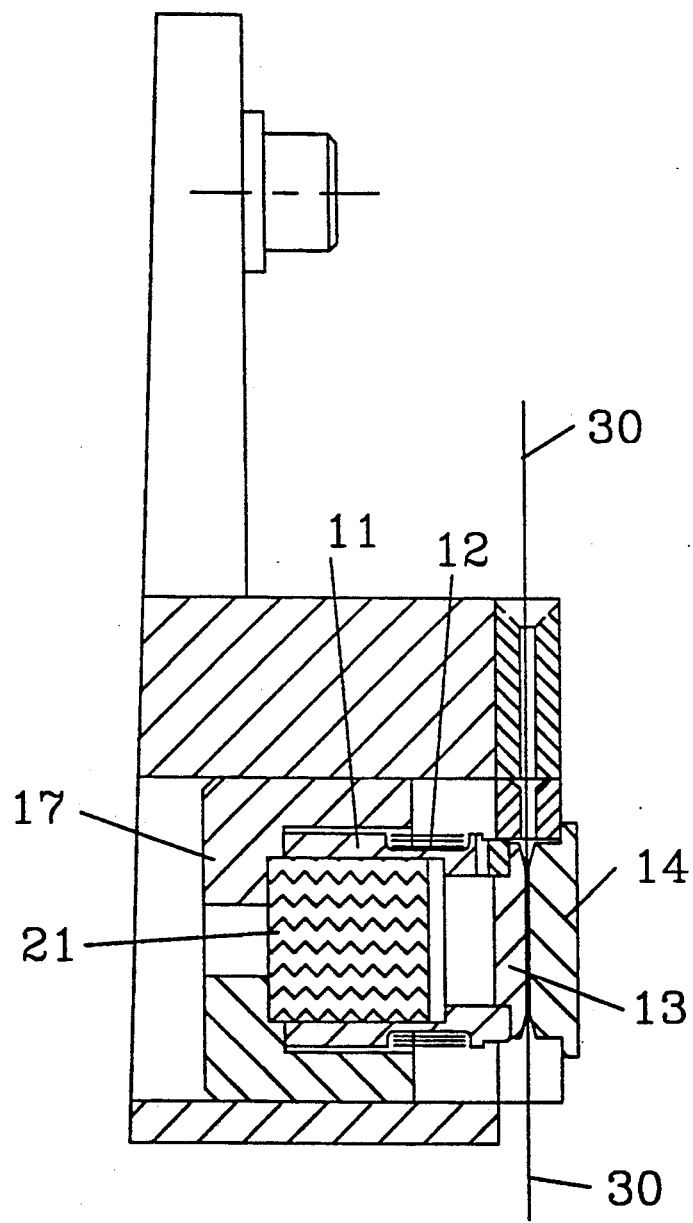
FIG. 4 is a cross-sectional view of the mounted tensioner taken through section 4—4 of FIG. 3.

FIG. 3 and cross-section view FIG. 4, taken through section 4—4 of FIG. 3, illustrate the tensioner assembly with coil interface leads 38 and air whose 35 with a gold bond wire 30 threaded through the tensioner assembly. Solder posts 38a and 38b are for connection of coil leads to connection lines 38. Mounting screws 41 and 42 hold the tensioner assembly to the bonder bond head (not illustrated).

Gold bond wire 30 enters the opening 30a in air actuated pull-back secured to mount 18. The bond wire 30 extends trough the opening 19a (FIG. 2) between the two clamp faces 13 and 14 and out the bottom of the tensioner assembly at 30c. The electrical signals that actuate the voice coil tensioner are applied to wire coil 12 via connection wires 38.

A wire pull-back assembly is shown at 40. An air line 35 is used to apply air around wire 30 through passages 36 and 37. The application of air to the bond wire passage retracts the bond wire to pull it out of opening 30a to take up slack in the bond wire.

The basic operation of the voice coil tensioner is illustrated in FIGS. 5a, 5b, 6a, 6b, 7a, and 7b. The force generated by the programmable tensioner is varied several times during a bond cycle. In FIGS. 5-7, it should be noted that tensioner 50 is stationary relative to primary clamp 51 and capillary 53. For purposes of illustration, the bond cycle is divided into six steps as follows.

Step 1

Figure 5A:
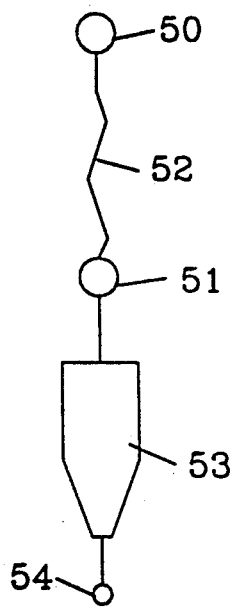
FIGS. 5a, 5b, 6a, 6b, 7a, and 7b illustrate the various positions and clamping conditions of the tensioner, primary wire clamp and capillary during a bonding cycle.
Figure 5B:
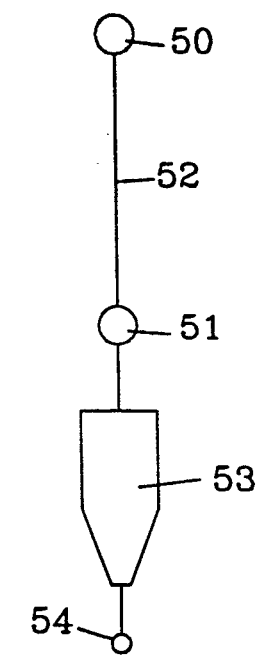

FIGS. 5a and 5b illustrate straightening the bond wire. At the beginning of the bond cycle, the tensioner 50 is employed as a wire straightener. With the primary clamp 51 closed, a small amount of drag force is applied to wire 52 so that as the capillary 53 moves toward the bond pad (not illustrated), gold wire 52 is drawn through the tensioner pads (tensioner 50). Drawing the wire through the pads helps to straighten wire 52 which may be slack or kinked between primary clamp 51 and tensioner 50.

Step 2

Figures 6A, 6B:
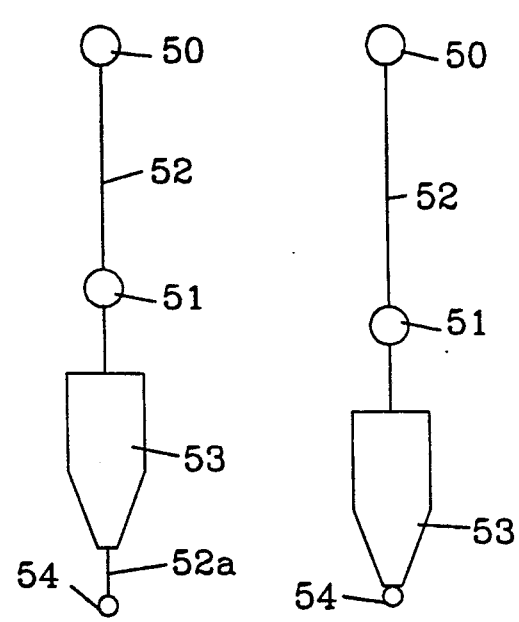

FIGS. 6a and 6b illustrate ball bond formation and ball pull back. At the beginning of a gold wire bonder bond cycle a gold sphere 54 is created at the end of bonding wire 52. For ball size consistency, the ball is formed below the end of the capillary 53 with a length of wire 52a between the ball 54 and the end of capillary 53. For ball placement accuracy and ball shape optimization however, it is desirable to remove length of wire 52a and center the ball in the end of the capillary before the ball bond is made. To do this the primary clamp 51 is opened and tensioner 50 is used to apply a small drag force to the wire. As capillary 53 moves downward toward the bond pad, ball 54 is brought to the desired location at the end of the capillary (FIG. 6b).

Step 3

Once the gold ball 54 touches down on the bond pad (not illustrated) and the bond is made, tensioner 50 is opened so that no force is exerted on the wire. Capillary 53 then rises to loop height stringing out the amount of wire calculated for the current loop.

Step 4

As the capillary moves toward the stitch position 56, tensioner 50 remains open and primary clamp 51 is closed.

Step 5

Figure 7A:
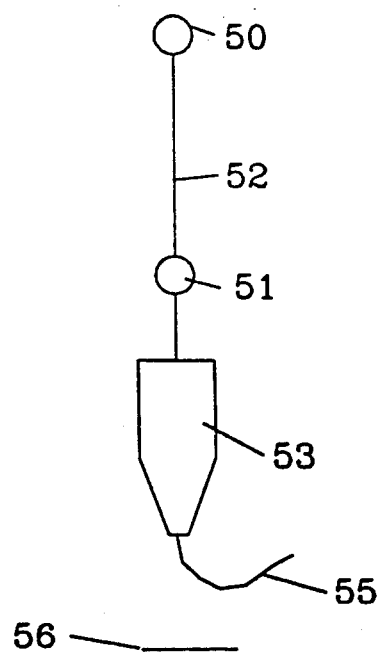
Figure 7B:
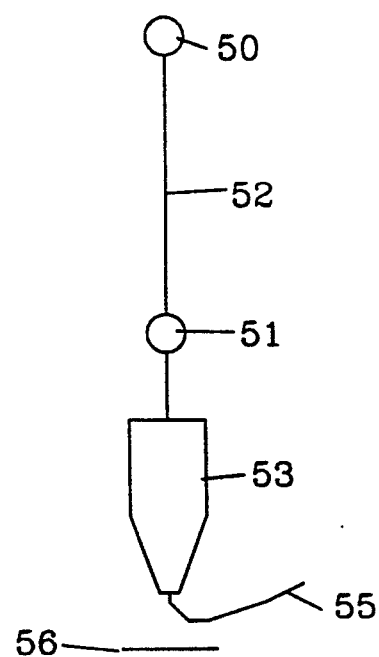

FIGS. 7a and 7b illustrate the operation at the pull back point above the stitch. At this point, the bond head is slowed. The primary clamp 51 is opened and the current in the voice coil (tensioner 50) is ramped up so that the jaw of the tensioner lightly impacts the gold wire. The tensioner 50 is then turned to "full on" and the capillary 53 continues down toward the stitch finger 56. In the "full on" state, tensioner 50 clamps gold wire 52 solidly and forces already strung wire to be pulled back up the capillary 53. This retraction of a predetermined amount of wire improves the wire dress of the bonded wire by pulling the wire span 55 straight and standing the wire up at the neck (neck not illustrated).

Step 6

After the stitch bond is made on stitch finger 56, tensioner 50 is again driven open. It stays open until after the formation of the next ball. The bond cycle then repeats.

Figure 8:
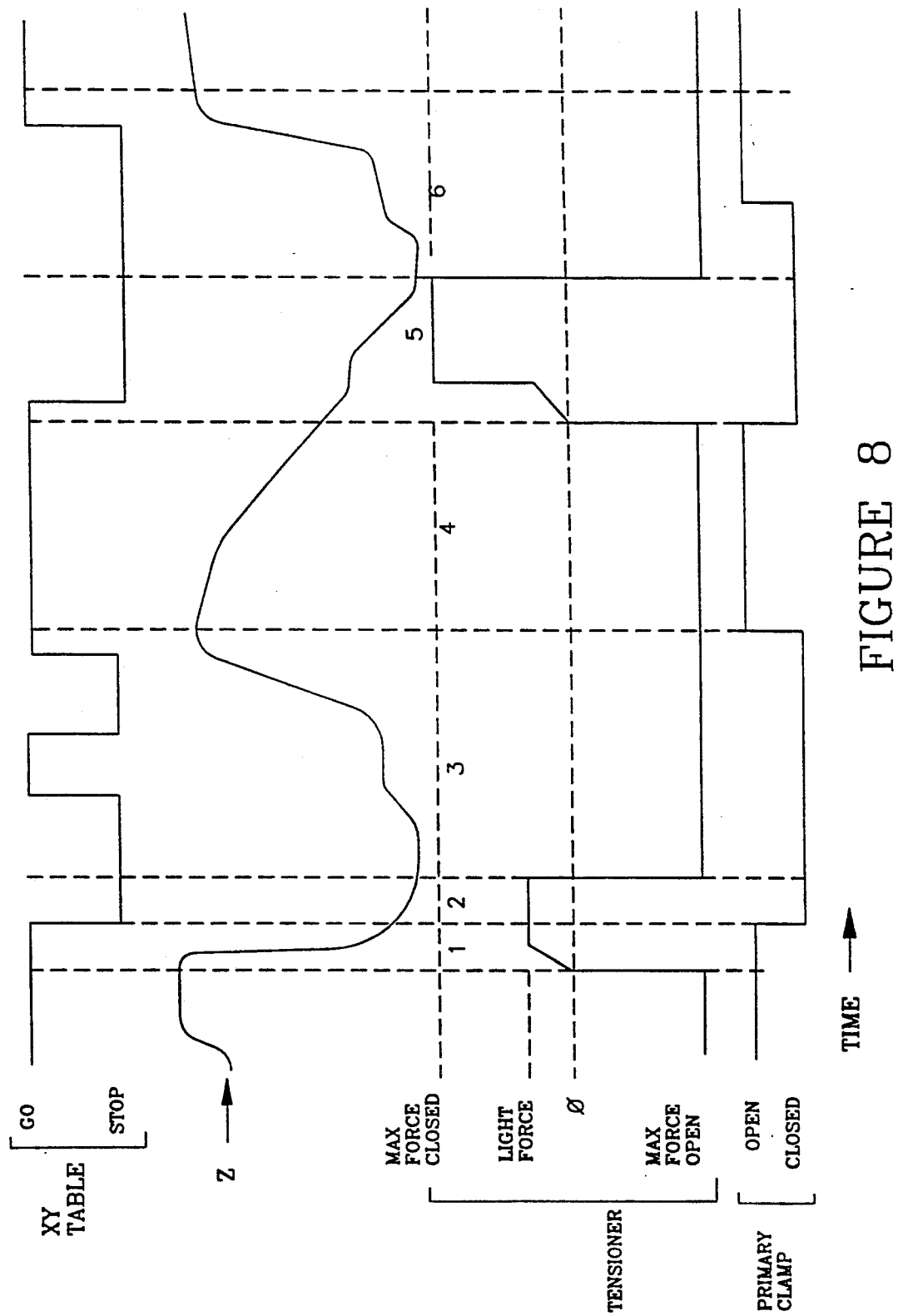
FIG. 8 is a diagram illustrating the bond cycle.

FIG. 8 illustrates the bond cycle of a wire bonder employing the programmable tensioner. It depicts the z axis position and the positions, opened and closed, of the primary clamp and the tensioner current control with respect to time. Also shown is the XY motor run bit. The plot is divided into 6 sections which correspond to the six steps discussed above. GO indicates the start of the motion of the XY table to which the bond head is attached. STOP indicates when the XY table is stopped during bonding. The curve indicated by Z is the vertical motion of the capillary through which the bond wire passes. The capillary tube is indicated as 53 in FIGS. 5-7. MAX FORCE CLOSED is the position of the programmable tensioner when maximum force is applied to clamp the wire in the tensioner. The line $\phi$ indicates when no current is directed through the tensioner coil. LIGHT FORCE indicates when there is a light tensioning force applied, and MAX FORCE OPEN indicates when a current is applied to the tensioner voice coil to force the tensioner to a maximum open state. Primary clamp open and closed is shown at the bottom of the graph.

Figure 9:
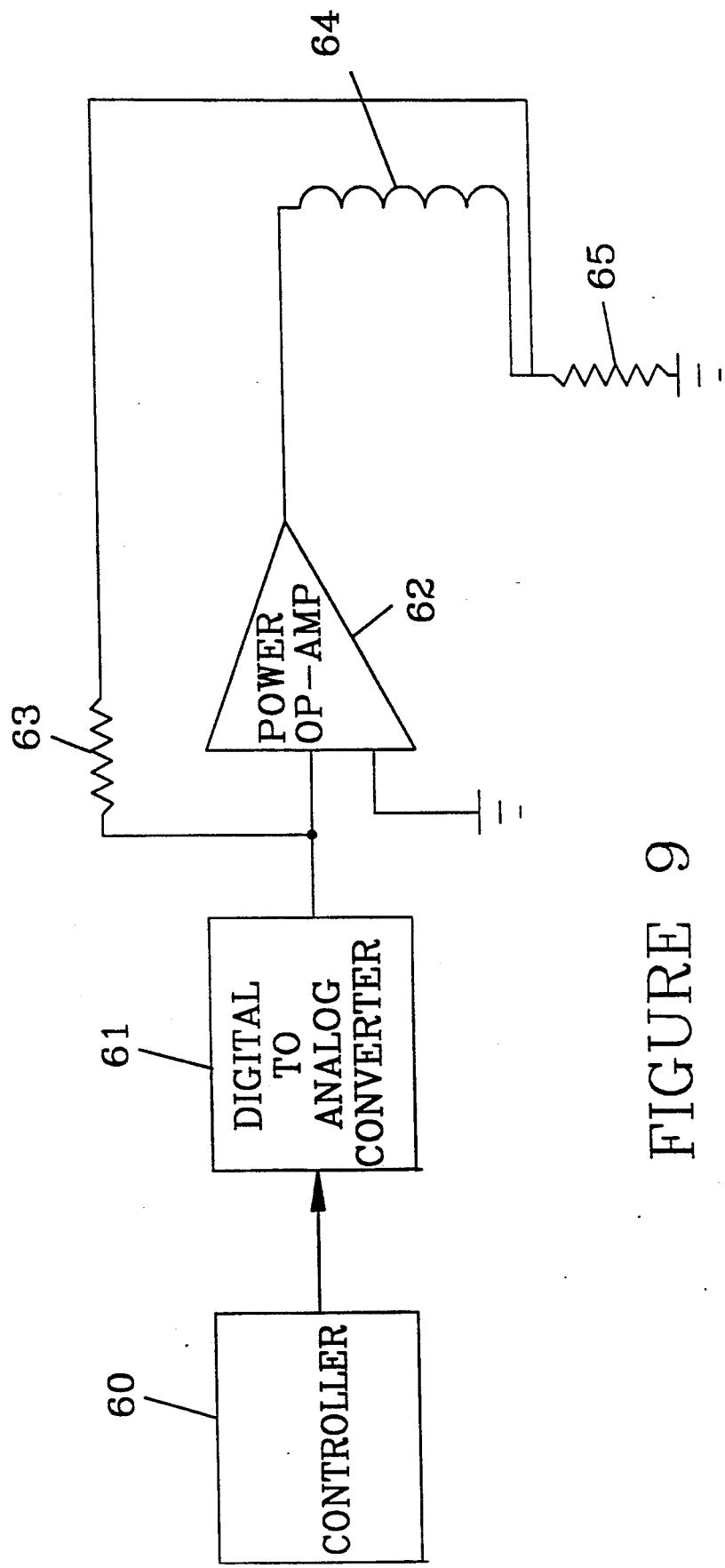
FIG. 9 is a block diagram of the control circuit of the tensioner.

FIG. 9 is a block diagram of the control circuit for the programmable tensioner. A software generated word is created in a controller 60. This digital word is converted in a digital-to-analog converter 61 to produce an analog signal applied to a Power Op Amp 62. The Op Amp provides the current to the voice coil 64 to operate the voice coil tensioner. Current sense resistor 65 is used to apply a feed back voltage to the Power Op-Amp. The control word generated in controller 60 is dependent upon which part of the bond cycle is in process. Controller is connected to, or is a part of the over all controller for the bonder.

The programmable tensioner solves the problem of dynamically varying the drag force applied to the wire during the bond cycle of a wire bonder.

What is claimed:

1. A programmable wire tensioner for a wire bonder, comprising:
   a fixed clamp face;
   a voice coil mechanism including a movable coil,
   a movable clamp face mounted on said movable coil, and adjacent to and spaced from said fixed clamp face; and
   wherein when a current is applied to said voice coil mechanism, said movable coil and movable clamp face moves toward said fixed clamp face to engage a bond wire between the movable and fixed clamp faces.

2. The programmable wire tensioner according to claim 1, wherein said voice coil mechanism comprises;
   a cup of ferro-magnetic material;
   a permanent magnet inside said metallic cup;
   a coil form in said cup movably positioned over said permanent magnet; and
   a coil wound on the said form;
   said movable clamp face attached to said coil form.

3. The programmable wire tensioner according to claim 1, wherein said fixed and movable clamp faces have polished clamp faces.

4. The programmable wire tensioner according to claim 2, wherein said coil form is of a non-magnetic material.

5. The programmable wire tensioner according to claim 1, including a controller and an amplifier to supply a variable clamping signal indicative of a clamping current to be applied to said voice coil, wherein said controller generates a signal indicative of the clamp force which is applied to the voice coil through said amplifier.

6. The programmable wire tensioner according to claim 5, wherein the programmable wire tensioner is mounted on a wire bonder bond head, and wherein the signal generated by said controller is determined in part on the position of the bonder bond head.

7. A programmable wire tensioner for a wire bonder, comprising:
   a fixed clamp face;
   a movable clamp face adjacent to and spaced from said fixed clamp face; and
   a voice coil mechanism including:
      a cup of ferro-magnetic material;
      a permanent magnet inside said metallic cup;
      a coil form in said cup movably positioned over said permanent magnet; and
      a coil wound on said coil form;
      said movable clamp face attached to said coil form; and
   wherein said movable clamp face is attached to said voice coil mechanism, and wherein when a current is applied to said voice coil mechanism, said movable clamp face moves toward said fixed clamp face to engage a bond wire between the movable and fixed clamp faces.

8. The programmable wire tensioner according to claim 7, wherein said fixed and movable clamp faces have polished clamp faces.

9. The programmable wire tensioner according to claim 7, wherein said coil form is of a non-magnetic material.

10. The programmable wire tensioner according to claim 7, including a controller and an amplifier to supply a variable clamping signal indicative of a clamping current to be applied to said voice coil, wherein said controller generates a signal indicative of the clamp force which is applied to the voice coil through said amplifier.

11. The programmable wire tensioner according to claim 10, wherein the programmable wire tensioner is mounted on a wire bonder bond head, and wherein the signal generated by said controller is determined in part on the position of the bonder bond head.

12. An improved wire bonder for bonding wires to semiconductor devices, wherein the wire bonder includes a bond head, a wire source, a wire clamp, and a program controller for controlling the motion and bonding action of the bonder bond head, the improvement including:
   a programmable wire tensioner used in conjunction with said wire clamp, said programmable wire tensioner comprising:
      a fixed clamp face;
      a voice coil mechanism including a movable coil,
      a movable clamp face mounted on said movable coil, and adjacent to and spaced from said fixed clamp face; and
   wherein when a current is applied to said voice coil mechanism, said movable coil and movable clamp face moves toward said fixed clamp face to engage a bond wire between the movable and fixed clamp faces.

13. The programmable wire tensioner according to claim 12, wherein said voice coil mechanism comprises;
   a cup of ferro-magnetic material;
   a permanent magnet inside said metallic cup;
   a coil form in said cup movably positioned over said permanent magnet; and
   a coil wound on said coil form;
   said movable clamp face attached to said coil form.

14. The programmable wire tensioner according to claim 12, wherein said fixed and movable clamp faces have polished clamp faces.

15. The programmable wire tensioner according to claim 13, wherein said coil form is of a non-magnetic material.

16. The programmable wire tensioner according to claim 12, including a controller and an amplifier to supply a variable clamping signal indicative of a clamping current to be applied to said voice coil, wherein said controller generates a signal indicative of the clamp force which is applied to the voice coil through said amplifier.

17. The programmable wire tensioner according to claim 16, wherein the programmable wire tensioner is mounted on a wire bonder bond head, and wherein the signal generated by said controller is determined in part on the position of the bonder bond head.

* * * * *